(12) United States Patent
Park

(10) Patent No.: US 8,385,143 B2
(45) Date of Patent: Feb. 26, 2013

(54) SEMICONDUCTOR MEMORY APPARATUS AND READ/WRITE CONTROL METHOD THEREOF

(75) Inventor: Heat Bit Park, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 130 days.

(21) Appl. No.: 12/970,915

(22) Filed: Dec. 16, 2010

(65) Prior Publication Data

US 2011/0242907 A1    Oct. 6, 2011

(30) Foreign Application Priority Data

Apr. 6, 2010    (KR) .................. 10-2010-0031364

(51) Int. Cl.
*G11C 7/00* (2006.01)

(52) U.S. Cl. ............... 365/193; 365/189.14; 365/189.15; 365/189.16; 365/191

(58) Field of Classification Search .................. 365/193, 365/191, 189.14, 189.15, 189.16
See application file for complete search history.

(56) References Cited

U.S. PATENT DOCUMENTS

| | | | | |
|---|---|---|---|---|
| 5,761,134 A | * | 6/1998 | Masuda et al. | 365/189.05 |
| 7,280,406 B2 | * | 10/2007 | Iwanari et al. | 365/185.21 |
| 7,653,780 B2 | * | 1/2010 | Takahashi | 711/106 |
| 8,009,486 B2 | * | 8/2011 | Kim | 365/189.05 |
| 2003/0035327 A1 | | 2/2003 | Nygren | |
| 2003/0053362 A1 | | 3/2003 | Kawaguchi et al. | |
| 2004/0090830 A1 | | 5/2004 | Lee et al. | |
| 2004/0252577 A1 | | 12/2004 | Kwak et al. | |

FOREIGN PATENT DOCUMENTS

| | | |
|---|---|---|
| JP | 2001-176267 | 6/2001 |
| KR | 1020080061007 A | 7/2008 |

* cited by examiner

*Primary Examiner* — Pho M Luu

(74) *Attorney, Agent, or Firm* — William Park & Associates Ltd.

(57) ABSTRACT

A semiconductor memory apparatus includes: a read/write control unit configured to generate a write control signal and a read control signal using internal signals generated through separate signal paths in response to a write command and a read command respectively; and a plurality of ranks configured to perform a write operation or read operation according to the write control signal or the read control signal.

13 Claims, 4 Drawing Sheets

SEMICONDUCTOR MEMORY APPARATUS AND READ/WRITE CONTROL METHOD THEREOF

CROSS-REFERENCES TO RELATED APPLICATION

The present application claims priority under 35 U.S.C. §119(a) to Korean Application No. 10-2010-0031364, filed on Apr. 6, 2010, in the Korean Intellectual Property Office, which is incorporated herein by reference in its entirety as if set forth in full.

BACKGROUND

1. Technical Field

The present invention relates to a semiconductor memory apparatus, more particularly, to a semiconductor memory apparatus and a read/write control method thereof.

2. Related Art

A conventional semiconductor memory apparatus generates a column address strobe signal CASP in response to a write command or read command, and generates a write control signal WT_EN and a read control signal IO_STROBE using the column address strobe signal CASP.

At this time, the write control signal WT_EN is used to designate the timing of writing external data into the semiconductor memory apparatus, and the read control signal IO_STROBE is used to designate the timing of reading out data stored in the semiconductor memory apparatus.

The operation of generating the write control signal WT_EN and the read control signal IO_STROBE will be described with reference to FIG. 1 when CMD to CMD delay (tCCD), an operation standard of a semiconductor memory apparatus, that is, delay between two commands CMD, is 2tCK.

According to a write command WTi and a read command RDi, positive-triggering pulses of column address strobe signal CASP having a width of 1tCK are sequentially generated.

According to the sequentially-generated pulses of column address strobe signal CASP, an internal signal PRE_AYP having a pulse width of 2tCK is generated.

At this time, the internal signal PRE_AYP should be generated in the form of two independent pulses for the write command WTi and the read command RDi, respectively.

However, since the CMD to CMD delay (tCCD) is 2tCK and the pulse width of the internal signal PRE_AYP is also 2tCK, the margin between the pulses of the internal signal PRE_AYP has a negative value. Accordingly, the internal signal PRE_AYP is generated in the form of one pulse in which two pulses become one.

As a result, an internal signal AYP which should be generated in the form of two independent pulses is also generated in the form of one pulse.

Finally, a write control signal WT_EN and a read control signal IO_STROBE, which abnormally have the same activation timing, are generated.

FIG. 2 is a timing diagram showing a case in which the internal signal PRE_AYP has a pulse width of less than 2tCK, for example, 1.5tCK.

In this case, the internal signal PRE_AYP and another internal signal AYP are respectively generated in the form of two independent pulses.

Accordingly, the write control signal WT_EN and the read control signal IO_STROBE are generated with a slight time difference provided therebetween.

However, since the timing margin for the internal signal AYP to latch an address ADD, that is, the sum of setup margin and hold margin becomes 2tCK less the AYP pulse width, the setup margin and the hold margin become insufficient. Furthermore, when a signal delay value or phase variation occurs due to a PVT variation, the write control signal WT_EN and the read control signal IO_STROBE may not be generated at accurate timings.

SUMMARY

A semiconductor memory apparatus and a read/write control method thereof which may cause signals for controlling a write/read operation to secure a sufficient margin within a range satisfying a predetermined standard are described herein.

In one embodiment, a semiconductor memory apparatus includes: a read/write control unit configured to generate a write control signal and a read control signal using internal signals generated through separate signal paths in response to a write command and a read command respectively; and a plurality of ranks configured to perform a write operation or read operation according to the write control signal or the read control signal.

In another embodiment, a read/write control method of a semiconductor memory apparatus includes: generating a write column address strobe signal and a read column address strobe signal through separate signal paths in response to sequentially inputted write and read commands respectively; latching a write address and a read address according to internal signals generated in response to the write column address strobe signal and the read column address strobe signal respectively, and generating the latched write address and the latched read address; and generating a write control signal and a read control signal using the latched write address and the latched read address respectively.

In another embodiment, a semiconductor memory apparatus includes: a write column address strobe signal generation unit configured to generate a write column address strobe signal in response to a write command; a write control signal generation unit configured to generate a write control signal using the write column address strobe signal and a write address; a read column address strobe signal generation unit configured to generate a read column address strobe signal in response to a read command; a read control signal generation unit configured to generate a read control signal using the read column address strobe signal and a read address; and a plurality of ranks configured to perform a write operation or read operation according to the write control signal or the read control signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
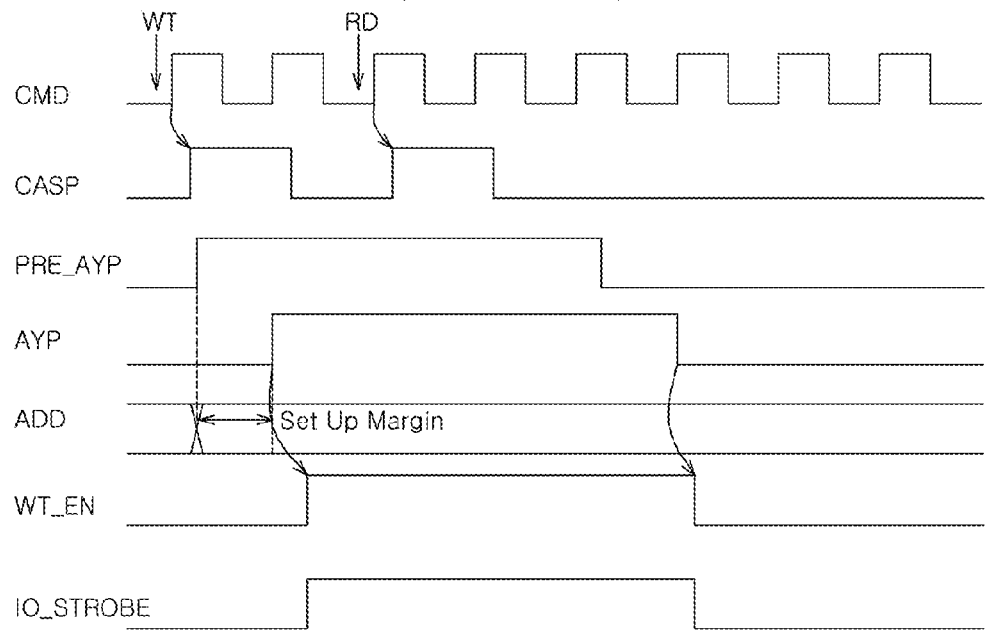
FIGS. 1 and 2 are read/write control signal generation timing diagrams according to a conventional semiconductor memory apparatus.
Figure 2:
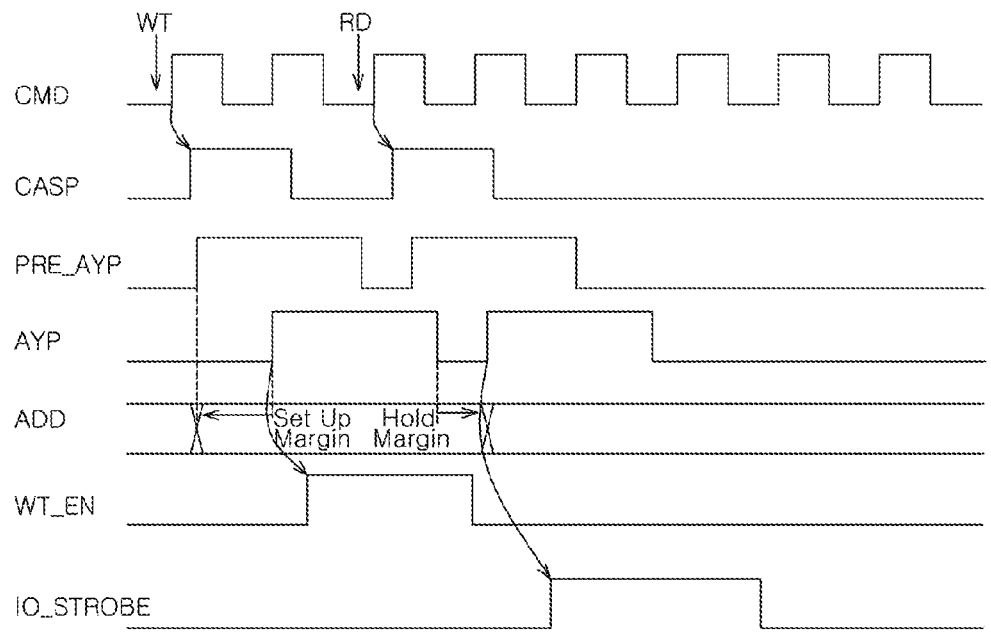

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 3:
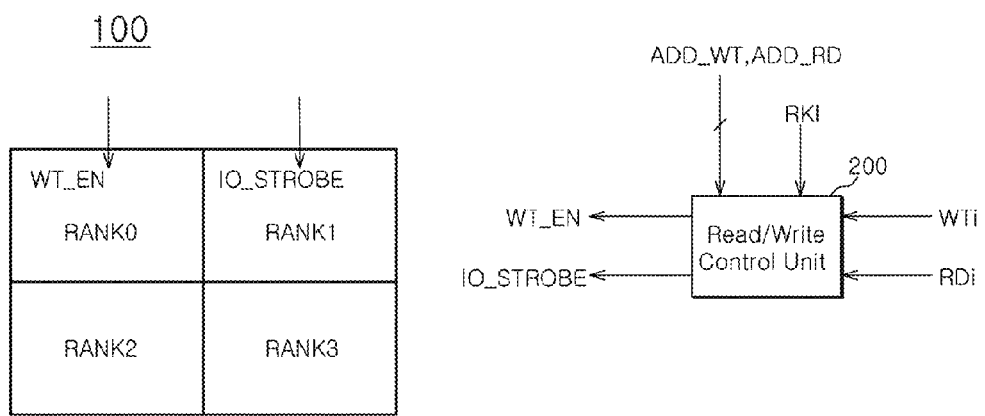
FIG. 3 is a block diagram of a semiconductor memory apparatus according to one embodiment.

Referring to FIG. 3, a semiconductor memory apparatus 100 according to one embodiment includes a plurality of ranks RANK0 to RANK3 and a read/write control unit 200.

A rank refers to a plurality of memory units, for example, chips, configured to operate as one unit.

A rank is used in a memory module in which a plurality of chips are stacked to increase memory capacity. A rank according to an embodiment may include a three-dimensionally stacked memory in which a plurality of chips are coupled using through silicon vias (TSV).

The read/write control unit 200 is configured to generate a write control signal WT_EN and a read control signal IO_STROBE using internal signals which are generated through independent signal paths separate from each other, in response to a write command WTi and a read command RDi respectively.

Furthermore, the read/write control unit 200 is configured to provide the write control signal WT_EN and the read control signal IO_STROBE to a rank corresponding to a rank selection signal RKI among the plurality of ranks RANK0 to RANK3.

The rank selection signal RKI is a signal having information for selecting any one rank to perform a write or read operation, among the plurality of ranks RANK0 to RANK3.

Figure 4:
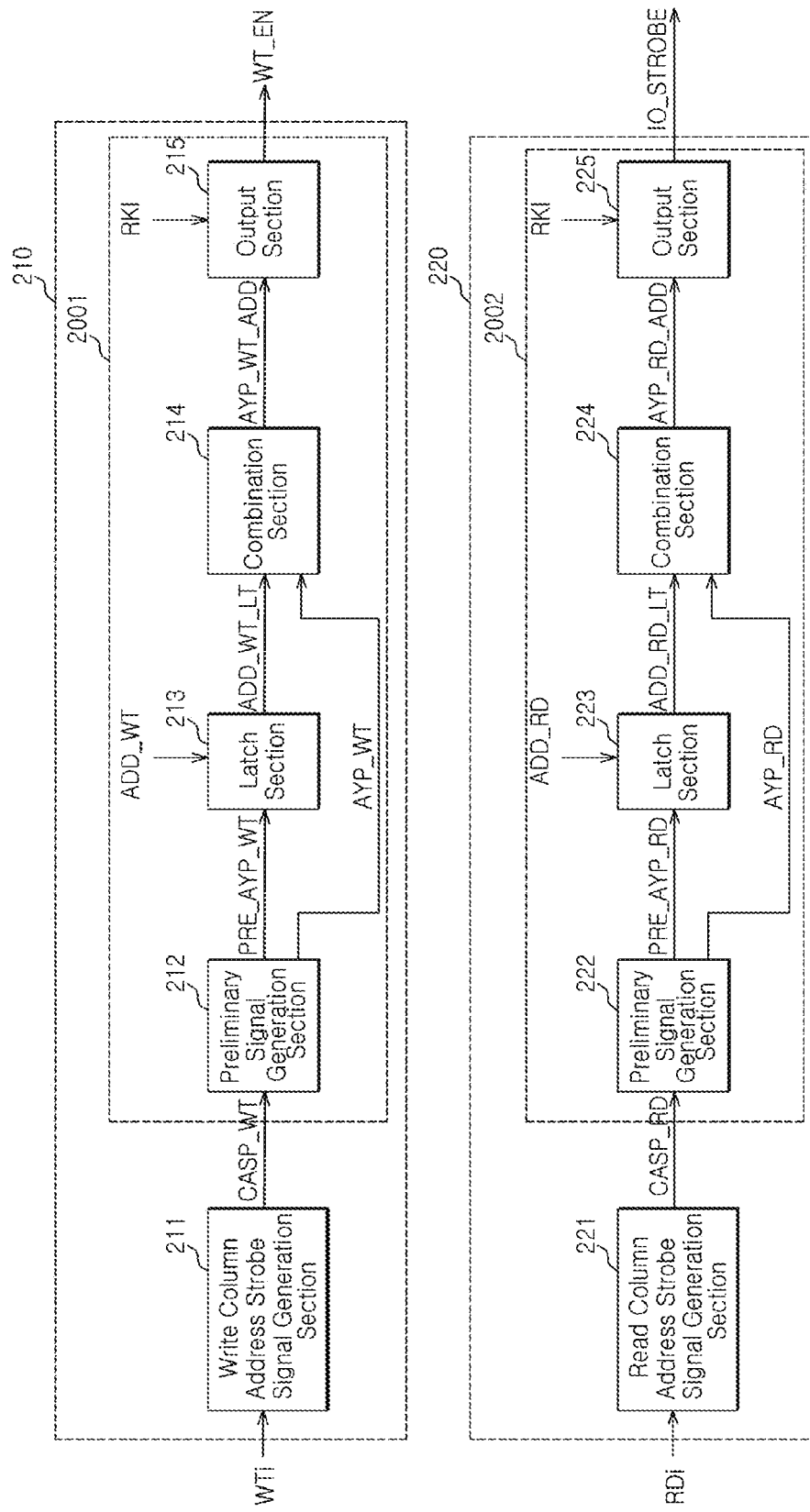
FIG. 4 is a block diagram illustrating the internal configuration of a read/write control unit of FIG. 3.

Referring to FIG. 4, the read/write control unit 200 includes a write control unit 210 and a read control unit 220.

The write control unit 210 is configured to generate the write control signal WT_EN using a write address ADD_WT and internal signals which are independently generated through a first signal path in response to the write command WTi.

The write control unit 210 includes a write column address strobe signal generation section 211 and a write control signal generation section 2001.

The write control signal generation section 2001 includes a preliminary signal generation section 212, a latch section 213, a combination section 214, and an output section 215.

The write column address strobe signal generation section 211 is configured to generate a write column address strobe signal CASP_WT having a predetermined pulse width, for example a pulse width of 1tCK, in response to the write command WTi.

The write column address strobe signal generation section 211 includes a flip-flop and a delay element. The flip-flop is configured to receive the write command WTi, and the delay element is configured to delay the write command WTi such that the write column address strobe signal CASP_WT has a pulse width of 1tCK.

The preliminary signal generation section 212 is configured to generate a first preliminary signal PRE_AYP_WT having an increased pulse width compared to that of the write column address strobe signal CASP_WT, for example a pulse width of 2tCK, and a second preliminary signal AYP_WT obtained by delaying the first preliminary signal PRE_AYP_WT by a predetermined time.

The preliminary signal generation section 212 includes a flip-flop and a delay element. The flip-flop is configured to receive the write column address strobe signal CASP_WT. The delay element is configured to delay the write column address strobe signal CASP_WT such that the first preliminary signal PRE_AYP_WT has a pulse width of 2tCK, and generate the second preliminary signal AYP_WT by delaying the first preliminary signal PRE_AYP_WT.

The latch section 213 is configured to latch a write address ADD_WT in response to the first preliminary signal PRE_AYP_WT and generate the latched write address ADD_WT_LT.

The combination section 214 is configured to combine the second preliminary signal AYP_WT and the latched write address ADD_WT_LT and generate a preliminary write control signal AYP_WT_ADD.

The output section 215 is configured to output the is preliminary write control signal AYP_WT_ADD as a write control signal WT_EN to a rank corresponding to a rank selection signal RKI among the plurality of ranks RANK0 to RANK3.

The read control section 220 is configured to generate a read control signal IO_STROBE using a read address ADD_RD and internal signals which are independently generated through a second signal path in response to the read command RDi.

The read control unit 220 includes a read column address strobe signal generation section 221 and a read control signal generation section 2002.

The read control signal generation section 2002 includes a preliminary signal generation section 222, a latch section 223, a combination section 224, and an output section 225.

The read column address strobe signal generation section 221 is configured to generate a read column address strobe signal CASP_RD having a predetermined pulse width, for example a pulse width of 1tCK, in response to the read command RDi.

The read column address strobe signal generation section 221 includes a flop-flop and a delay element. The flip-flop is configured to receive the read command RDi, and the delay element is configured to delay the read command RDi such that the read column address strobe signal CASP_RD has a pulse width of 1tCK.

The preliminary signal generation section 222 is configured to generate a first preliminary signal PRE_AYP_RD having an increased pulse width greater than that of the read column address strobe signal CASP_RD, for example a pulse width 2tCK, and a second preliminary signal AYP_RD obtained by delaying the first preliminary signal PRE_AYP_RD by a predetermined time.

The preliminary signal generation section 222 includes a flop-flop and a delay element. The flip-flop is configured to receive the read column address strobe signal CASP_RD. The delay element is configured to delay the read column address strobe signal CASP_RD such that the first preliminary signal PRE_AYP_RD has a pulse width of 2tCK, and generate the second preliminary signal AYP_RD by delaying the first preliminary signal PRE_AYP_RD.

The latch section 223 is configured to latch the read address ADD_RD in response to the first preliminary signal PRE_AYP_RD and generate the latched read address ADD_RD_LT.

The combination section 224 is configured to combine the second preliminary signal AYP_RD and the latched read address ADD_RD_LT and generate a preliminary read control signal AYP_RD_ADD.

The output section 225 is configured to output the preliminary read control signal AYP_RD_ADD as the read control signal IO_STROBE to a rank corresponding to the rank selection signal RKI among the plurality of ranks RANK0 to RANK3.

Figure 5:
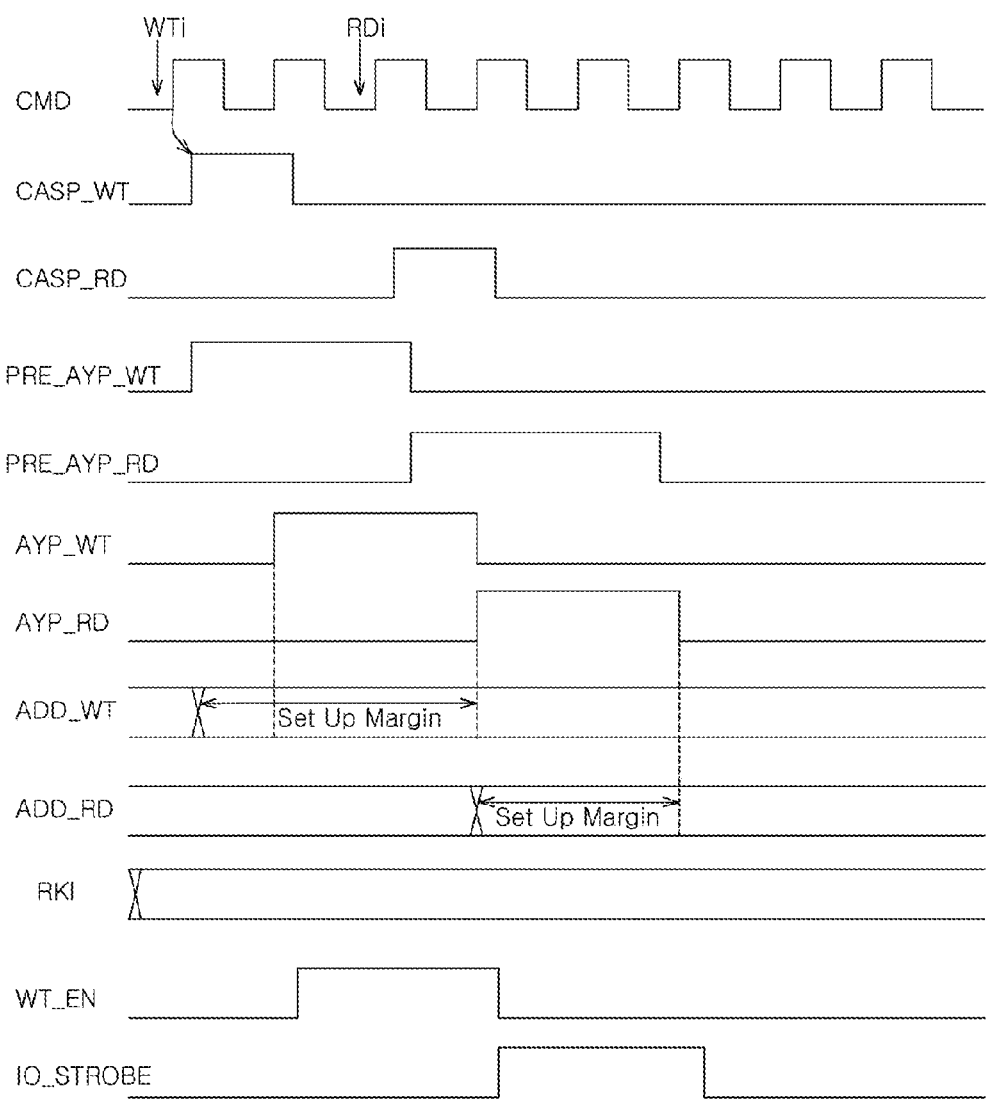
FIG. 5 is an operation timing diagram of the read/write control unit 200 of FIG. 4.

Referring to FIGS. 4 and 5, a read/write control method of the semiconductor memory apparatus according to the embodiment will be described as follows.

It is assumed that the write command WTi and the read command RDi are inputted according to a predetermined standard, 2tCCD. It is further assumed that the write command WTi designates the rank RANK0 and the read command RDi designates the rank RANK1. Thus, when the write command WTi is inputted, the rank selection signal RKI defines the rank RANK0, and when the read command RDi is inputted, the rank selection signal RKI defines the rank RANK1.

First, the write operation will be described.

The write column address strobe signal generation section 211 generates the write column address strobe signal CASP_WT according to the write command WTi.

The preliminary signal generation section 212 generates the first preliminary signal PRE_AYP_WT and the second preliminary signal AYP_WT according to the write column address strobe signal CASP_WT.

The latch section 213 latches the write address ADD_WT according to the first preliminary signal PRE_AYP_WT and generates the latched write address ADD_WT_LT.

The combination section 214 combines the second preliminary signal AYP_WT and the latched write address ADD_WT_LT and generates the preliminary write control signal AYP_WT_ADD.

The preliminary write control signal AYP_WT_ADD possesses address information through the operation of the combination section 214.

The output section 215 outputs the preliminary write control signal AYP_WT_ADD as the write control signal WT_EN to a rank corresponding to the rank selection signal RKI, the rank RANK0 as assumed, among the plurality of ranks RANK0 to RANK4.

The rank RANK0 writes externally provided data in a memory area corresponding to the write address ADD_WT during a time determined by the write control signal WT_EN.

Next, the read operation will be described.

The read column address strobe signal generation section 221 generates the read column address strobe signal CASP_RD according to the read command RDi.

The preliminary signal generation section 222 generates the first preliminary signal PRE_AYP_RD and the second preliminary signal AYP_RD according to the read column address strobe signal CASP_RD.

The latch section 223 latches the read address ADD_RD according to the first preliminary signal PRE_AYP_RD and generates the latched read address ADD_RD_LT.

The combination section 224 combines the second preliminary signal AYP_RD and the latched read address ADD_RD_LT and generates the preliminary read control signal AYP_RD_ADD.

The preliminary read control signal AYP_RD_ADD possesses address information through the operation of the combination section 224.

The output section 225 outputs the preliminary read control signal AYP_RD_ADD as the read control signal IO_STROBE to a rank corresponding to the rank selection signal RKI, the rank RANK1 as assumed, among the plurality of ranks RANK0 to RANK3.

The rank RANK1 outputs data written in a memory area corresponding to the read address ADD_RD determined by the read control signal IO_STROBE to the outside.

According to the above-described embodiment, the internal signals CASP_WT, PRE_AYP_WT, AYP_WT, and AYP_WT_ADD used to generate the write control signal WT_EN, and the internal signals CASP_RD, PRE_AYP_RD, AYP_RD, and AYP_RD_ADD used to generate the read control signal IO_STROBE, are passed through separate signal paths.

Therefore referring to FIG. 5, a sufficient margin required for latching an address may be provided regardless of the pulse widths of the internal signals, even when a standard of 2tCCD is defined between different ranks.

Thus a semiconductor memory apparatus according to the embodiment operates according to the standard of 2tCCD, but has a setup margin corresponding to substantially the same level as a semiconductor memory apparatus which operates according to the standard of 4tCCD.

While certain embodiments have been described above, it will be understood to those skilled in the art that the embodiments described are by way of example only. Accordingly, the semiconductor memory apparatus and the read/write control method described herein should not be limited based on the described embodiments. Rather, the semiconductor memory apparatus and the read/write control method described herein should only be limited in light of the claims that follow when taken in conjunction with the above description and accompanying drawings.

What is claimed is:

1. A semiconductor memory apparatus comprising:
   a read/write control unit configured to generate a write control signal and a read control signal using internal signals generated through separate signal paths in response to a write command and a read command respectively, wherein the read/write control unit comprises:
      a write control unit configured to generate the write control signal using a write address and internal signals generated through a first signal path in response to the write command; and
      a read control unit configured to generate the read control signal using a read address and internal signals generated through a second signal path in response to the read command; and
   a plurality of ranks configured to perform a write operation or read operation according to the write control signal or the read control signal.

2. The semiconductor memory apparatus according to claim 1, wherein each of the ranks comprises a plurality of chips coupled using through silicon vias (TSV).

3. The semiconductor memory apparatus according to claim 1, wherein the read/write control unit is configured to provide the write control signal and the read control signal to a rank corresponding to a rank selection signal among the plurality of ranks.

4. The semiconductor memory apparatus according to claim 1, wherein the write control unit comprises:
   a write column address strobe signal generation section configured to generate a write column address strobe signal in response to the write command; and
   a write control signal generation section configured to generate a preliminary write control signal using the write column address strobe signal and a write address, and output the generated preliminary write control signal as the write control signal to a rank corresponding to a rank selection signal among the plurality of ranks.

5. The semiconductor memory apparatus according to claim 1, wherein the read control unit comprises:

a read column address strobe signal generation section configured to generate a read column address strobe signal in response to the read command; and a read control signal generation section configured to generate a preliminary read control signal using the read column address strobe signal and a read address, and output the generated preliminary read control signal as the read control signal to a rank corresponding to a rank selection signal among the plurality of ranks.

6. A read/write control method of a semiconductor memory apparatus, comprising:

generating a write column address strobe signal and a read column address strobe signal through separate signal paths in response to sequentially inputted write and read commands respectively;

latching a write address and a read address according to internal signals generated in response to the write column address strobe signal and the read column address strobe signal respectively, and generating the latched write address and the latched read address; and generating a write control signal and a read control signal using the latched write address and the latched read address respectively.

7. The read/write control method according to claim 6, further comprising, providing the write control signal and the read control signal to a rank corresponding to a rank selection signal.

8. A semiconductor memory apparatus comprising:

a write column address strobe signal generation unit configured to generate a write column address strobe signal in response to a write command;

a write control signal generation unit configured to generate a write control signal using the write column address strobe signal and a write address;

a read column address strobe signal generation unit configured to generate a read column address strobe signal in response to a read command;

a read control signal generation unit configured to generate a read control signal using the read column address strobe signal and a read address; and a plurality of ranks configured to perform a write operation or read operation according to the write control signal or the read control signal.

9. The semiconductor memory apparatus according to claim 8, wherein each of the ranks comprises a plurality of chips coupled using TSVs.

10. The semiconductor memory apparatus according to claim 8, wherein the write control signal generation unit is configured to provide the write control signal to a rank corresponding to a rank selection signal among the plurality of ranks.

11. The semiconductor memory apparatus according to claim 8, wherein the read control signal generation unit is configured to provide the read control signal to a rank corresponding to a rank selection signal among the plurality of ranks.

12. The semiconductor memory apparatus according to claim 8, wherein the write control signal generation unit comprises:

a preliminary signal generation section configured to generate a first preliminary signal having an increased pulse width greater than that of the write column address strobe signal, and a second preliminary signal obtained by delaying the first preliminary signal by a predetermined time;

a latch section configured to latch the write address in response to the first preliminary signal and generate the latched write address;

a combination section configured to combine the second preliminary signal and the latched write address, and generate a preliminary write control signal; and an output section configured to output the preliminary write control signal as the write control signal to a rank corresponding to a rank selection signal among the plurality of ranks.

13. The semiconductor memory apparatus according to claim 8, wherein the read control signal generation unit comprises:

a preliminary signal generation section configured to generate a first preliminary signal having an increased pulse width greater than that of the read column address strobe signal, and a second preliminary signal obtained by delaying the first preliminary signal by a predetermined time;

a latch section configured to latch the read address in response to the first preliminary signal and generate the latched read address;

a combination section configured to combine the second preliminary signal and the latched read address, and generate a preliminary read control signal; and an output section configured to output the preliminary read control signal as the read control signal to a rank corresponding to a rank selection signal among the plurality of ranks.

* * * * *